United States Patent

Hirotani et al.

[11] Patent Number: 6,044,169
[45] Date of Patent: Mar. 28, 2000

[54] METHOD AND APPARATUS FOR MOUNTING ELECTRONIC COMPONENT

[75] Inventors: Koji Hirotani, Osaka; Tomoyuki Nakano, Kofu; Ryoji Inutsuka, Osaka; Kunio Ohe, Hirakata, all of Japan

[73] Assignee: Matsushita Electric Industrial Co., Ltd., Osaka, Japan

[21] Appl. No.: 08/981,650

[22] PCT Filed: Jul. 11, 1996

[86] PCT No.: PCT/JP96/01928

§ 371 Date: Jan. 8, 1998

§ 102(e) Date: Jan. 8, 1998

[87] PCT Pub. No.: WO97/03547

PCT Pub. Date: Jan. 30, 1997

[30] Foreign Application Priority Data

Jul. 12, 1995 [JP] Japan ................................ 7-175800

[51] Int. Cl.⁷ .............................. G06K 9/00; B23P 19/00
[52] U.S. Cl. ............................................ 382/145; 29/740
[58] Field of Search ................................ 382/145; 29/743, 29/740, 712, 833, 741; 228/102; 356/375

[56] References Cited

U.S. PATENT DOCUMENTS

| | | | |
|---|---|---|---|
| 4,793,707 | 12/1988 | Hata et al. | 356/375 |
| 5,033,783 | 7/1991 | Izumi et al. | 294/64.1 |
| 5,212,881 | 5/1993 | Nishitsuka et al. | 29/740 |
| 5,233,745 | 8/1993 | Morita | 29/705 |
| 5,307,558 | 5/1994 | Izume et al. | 29/712 |
| 5,377,405 | 1/1995 | Sakurai et al. | 29/740 |
| 5,619,328 | 4/1997 | Sakurai | 356/375 |
| 5,667,129 | 9/1997 | Morita et al. | 228/102 |

FOREIGN PATENT DOCUMENTS

| | | | |
|---|---|---|---|
| 3-22720 | 3/1991 | Japan | H05K 13/00 |
| 4-346297 | 12/1992 | Japan | H05K 13/00 |
| 6-61694 | 3/1994 | Japan | H05K 13/04 |

Primary Examiner—Leo H. Boudreau
Assistant Examiner—Shawn B. Cage
Attorney, Agent, or Firm—Wenderoth, Lind & Ponack, L.L.P.

[57] ABSTRACT

In a method and an apparatus for mounting of electronic components onto a board, there are provided a head section (35) having a plurality of nozzles (12, 13) for sucking electronic components and a recognition camera (15) for recognizing a posture of a sucked electronic component through its image. A controller (1) is provided for controlling the head section so that after the electronic components at a component feed section (30) are sucked by the nozzles, the sucked posture is image-recognized by the recognition camera and corrected. The controller (1) is provided with a mounting procedure selection routine (11) for selectively driving the head section while one board is subjected to mounting, according to one of a first mounting procedure whereby one component is sucked and the sucked component is mounted by one of the nozzles and a different component is sucked and the sucked component is mounted by the other of the nozzles and a second mounting procedure whereby electronic components sucked by two nozzles are consecutively mounted after one electronic component is sucked by one nozzle and the other electronic component is sucked by the other nozzle.

30 Claims, 11 Drawing Sheets

*Fig.9A*
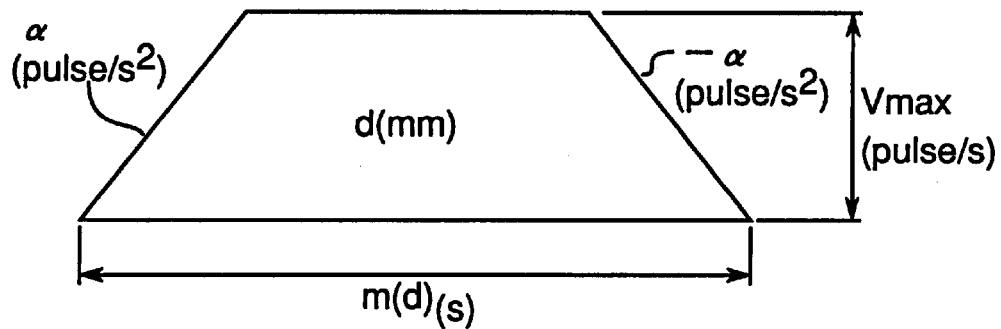
*Fig.9B*
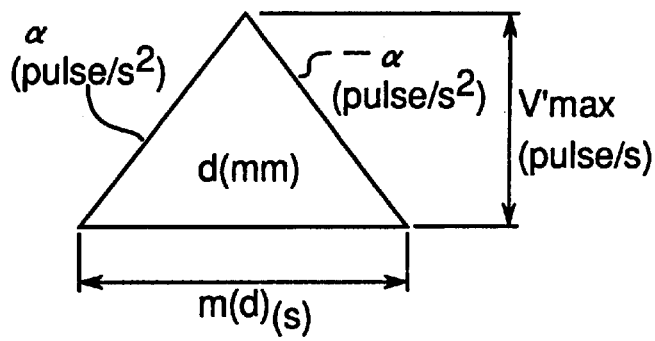
*Fig.10*
| DATA NAME | PARAMETER | SYMBOL(UNIT : s) |
|---|---|---|
| SHAFT MOVEMENT TIME DATA | SUCKING / MOUNTING TIME<br>ARCH MOTION TIME<br>MOVING TIME OF SLIDE UNIT | h<br>a<br>s |
| RECOGNITION TIME DATA | SUCKING / MOUNTING ATTITUDE RECOGNITION TIME | r |

METHOD AND APPARATUS FOR MOUNTING ELECTRONIC COMPONENT

TECHNICAL FIELD

The present invention relates to a method and an apparatus for mounting electronic components on boards.

BACKGROUND ART

In these days, shortening of a time for mounting electronic components is increasingly required to improve productivity.

Hereinbelow, an example of a conventional electronic component mounting apparatus will be described with reference to the drawings. FIG. 12 schematically illustrates the whole constitution of a conventional mounting apparatus. In FIG. 12, 30 is an electronic component feed section for supplying an electronic component 31, and 32 is a board. 35 is a head section having two, i.e., a first and a second suction nozzles 12, 13 and a recognition camera 15, 33 is an X-axis table for moving the head section 35 in an X-axis direction, and 34 is a Y-axis table for moving the head section 35 in a Y-axis direction orthogonal to the X-axis direction which is a direction of the movement of the head section 35 by the X-axis table 33. The head section 35 is positioned at an optional position by the X-axis and Y-axis tables 33, 34. 100 is a main controller for the mounting apparatus and 104 is an operation panel of the apparatus.

In the conventional mounting apparatus of this type, the electronic component 31 in the component feed section 30 is mounted to the board 32 by the head section 35 in a single mounting procedure. That is, sucking of one component and mounting of one component are alternately carried out repeatedly.

The mounting procedure at the head section 35 is diagrammatically represented in FIGS. 3A–3J. FIG. 5 is a timing chart of the procedure. Portions shown by inclined lines in the timing chart from the "movement of the head section" to the "corrective rotation of the second nozzle" excluding the "recognition" process represents where the head section 35 is being driven, and portions shown by horizontal lines represent where the head section 35 is not driven. In the recognition process, upper straight parts are where the recognition process is executed, lower straight parts are where the recognition process is stopped and fine sawtoothed parts are where the recognition process is kept in a standby mode by a timer. After receiving a movement completion signal of a slide unit 14, a mirror in the slide unit 14 is vibrated consequent to the movement of the slide unit 14. The recognition process is not started until the vibration of the mirror is stopped, and the above standby time is provided for the mirror to stop vibrating. Referring to FIGS. 3A–3J, 12 is the first nozzle in the head section 35 and, 13 is the second nozzle also set in the head section 35 together with the first nozzle 12. 14 is the slide unit having a plurality of reflecting mirrors and set in the head section 35, and the slide unit 14 transmits a light image of the electronic component 31 sucked by the first or second nozzle 12, 13 to the recognition camera 15 of the head section 31 via the reflecting mirrors thereof. In the head section 35, the slide unit 14 moves in a horizontal direction between the first and second nozzles 12 and 13 to the recognition camera 15. The light image of the electronic component sucked by the first nozzle 12 is transmitted to the recognition camera 15 via the slide unit 14 at the side of the first nozzle 12. On the other hand, the light image of the electronic component sucked by the second nozzle 13 is transmitted to the recognition camera 15 via the slide unit 14 at the side of the second nozzle 13.

In the first place, the head section 35 is moved through the movement of the X-axis and Y-axis tables 33, 34 to a suction position 19 of the feed section 30 for suction by the first nozzle 12 (FIG. 3A). When the head section 35 is completely moved to the suction position 19 of the feed section 30, the first nozzle 12 descends, thereby sucking an electronic component 17 located at the suction position 19 (FIG. 3B). At this time, the second nozzle 13 is at a raised position and the slide unit 14 is set at the side of the second nozzle 13, so that the first nozzle 12 is allowed to move up and down. After the sucking of the electronic component 17 by the first nozzle 12 is completed, the first nozzle 12 moves upward and the head section 35 starts to move to a mounting position 20 of the board 32 for an electronic component 16 which has been sucked by the second nozzle 13 in a previous sucking operation (FIG. 3C). During the time when the head section 35 is moved to the suction position 19, the electronic component 17 is sucked by the first nozzle 12 and the head section 35 is moved to the mounting position 20, a sucked posture of the electronic component 16 by the second nozzle 13 is recognized by the recognition camera 15 via the slide unit 14, and the posture of the electronic component 16 relative to the head section 35 is corrected. As is well known, this correction is executed by minutely moving the second nozzle 13 to an optional position in the X-axis and Y-axis directions, or rotating the second nozzle 13 about its center axis. When the first nozzle 12 moves up completely, the slide unit 14 moves towards the first nozzle 12 (FIG. 3D). Upon completion of the movement of the slide unit 14 to the first nozzle 12 and of the head section 35 to the mounting position 20 of the board 32 for the electronic component 16 sucked by the second nozzle 13, the second nozzle 13 moves down to mount the sucked electronic component 16 to the mounting position 20 on the board 32 (FIG. 3E).

When the second nozzle 13 completes the mounting of the electronic component 16 to the board 32, the second nozzle 13 moves upward and the head section 35 starts to move to a suction position 21 over the feed section 30 for the next electronic component 18 to be sucked by the second nozzle 13 (FIG. 3F). When the head section 35 reaches the suction position 21 for the electronic component 18 to be sucked by the second nozzle 13, the second nozzle 13 moves down to suck the electronic component 18 at the suction position 21 (FIG. 3G). After the second nozzle 13 completely sucks the electronic component 18, the second nozzle 13 moves up and the head section 35 starts to move to a mounting position 22 of the board 32 for the electronic component 17 sucked by the first nozzle 12 (FIG. 3H). During this time while the head section 35 moves to the suction position 21, the second nozzle 13 sucks the electronic component 18 and the head section 35 moves to the mounting position 22, a posture of the electronic component 17 sucked by the first nozzle 12 is recognized by the recognition camera 15. The posture of the electronic component 17 relative to the head section 35 is corrected by minutely moving the first nozzle 12 to an optional position in the X- and Y-axes directions or rotating the first nozzle 12 about its central axis, as is well known. When the second nozzle 13 completely moves up, the slide unit 14 moves towards the second nozzle 13 (FIG. 3I). When the slide unit 14 comes to the side of the second nozzle 13 and the head section 35 completely moves to the mounting position 22 of the board 32 for the electronic component 17 sucked by the first nozzle 12, the first nozzle 12 moves down to mount the sucking electronic component 17 to the mounting position 22 of the board 32 (FIG. 3J). When completing the mounting of the electronic component 17, the first nozzle 12 moves up and the head section 35 starts to move to a suction position for the next electronic component 17 (FIG. 3A). This sequence of operations is repeated afterwards to sequentially mount electronic components.

According to the mounting procedure as above, the head section 35 reciprocates for each electronic component between the feed section 30 and the board 32. Therefore, a mounting time is easily adversely influenced by a distance between the suction position of the feed section 30 and the mounting position of the board 32. The mounting time is increased as the distance is increased. In other words, the above single mounting procedure generates a loss of time if adopted for a board having mounting points elongating the distance of the move of the head section 35. Since the mounting procedure includes unfavorable circumstances as above to increase the mounting time in each process, the single use of the mounting procedure accompanies a loss in mounting time per board.

The present invention has for its object to provide a method and an apparatus for mounting electronic components whereby a loss in mounting time caused by a single mounting procedure is reduced, to thereby shorten the mounting time per board.

DISCLOSURE OF INVENTION

According to one aspect of the present invention, there is provided a method for mounting electronic components in a corrected suction posture onto a board. In this method, electronic components of an electronic component feed section are sucked by nozzles with the use of a head section having a plurality of nozzles for sucking the electronic components of the feed section and a recognition camera for recognizing a posture of the electronic component sucked by each of the nozzles through images. Then a sucked posture of the electronic component is image-recognized by the recognition camera and corrected, by selectively driving the head section while electronic components are mounted to one board, according to one of a first mounting procedure so that one of the plurality of nozzles sucks and mounts one electronic component and then the other nozzle sucks and mounts a different electronic component and a second mounting procedure so that the plurality of nozzles suck electronic components consecutively and then mount the sucked electronic components consecutively.

According to another aspect of the present invention, there is provided an apparatus for mounting electronic components onto a board. The apparatus comprises a head section having a plurality of nozzles for sucking electronic components of an electronic component feed section and a recognition camera for recognizing a posture of the electronic component sucked by each of the nozzles through its image. A control part controls the head section so that after the nozzles suck the electronic components of the component feed section, the recognition camera recognizes a sucked posture of the electronic component through its image, whereby the posture of the component is corrected and the electronic components are mounted on the board. The control part is provided with a mounting procedure selection means for selectively driving the head section while electronic components are mounted to one board, according to one of a first mounting procedure whereby one of the plurality of nozzles sucks and mounts one electronic component and then the other nozzle sucks and mounts a different electronic component and a second mounting procedure whereby the plurality of nozzles suck electronic components consecutively and then mount the sucked electronic components consecutively.

According to the mounting method and apparatus of the present invention, while one board is subjected to mounting of electronic components, the head section is selectively driven according to one of the first mounting procedure whereby one electronic component is completely sucked and mounted and then a next electronic component is sucked and mounted, and the second mounting procedure whereby two electronic components are sucked and then mounted. When a suitable one of the mounting procedures is selected, a loss in mounting time generated if the mounting is necessarily carried out single procedure is decreased. The mounting time for every board is shortened.

For instance, if a time required in each mounting procedure is calculated before the start of mounting and the mounting procedure of a shorter required time is automatically selected, the mounting time for each board is automatically reduced.

If an operator selects from the two mounting procedures, the mounting procedures can be optionally used.

BRIEF DESCRIPTION OF DRAWINGS

These and other aspects and features of the present invention will become clear from the following description taken in conjunction with the preferred embodiments thereof with reference to the accompanying drawings, in which:

FIGS. 9A and 9B are explanatory diagrams of an equal velocity movement of an X-axis table and a Y-axis table used for calculating the mounting time in the embodiment when a maximum velocity is achieved and when the maximum velocity is not achieved;

FIG. 10 is an explanatory diagram of parameters used for calculating the mounting time in the embodiment;

PREFERRED EMBODIMENT

Figure 1:
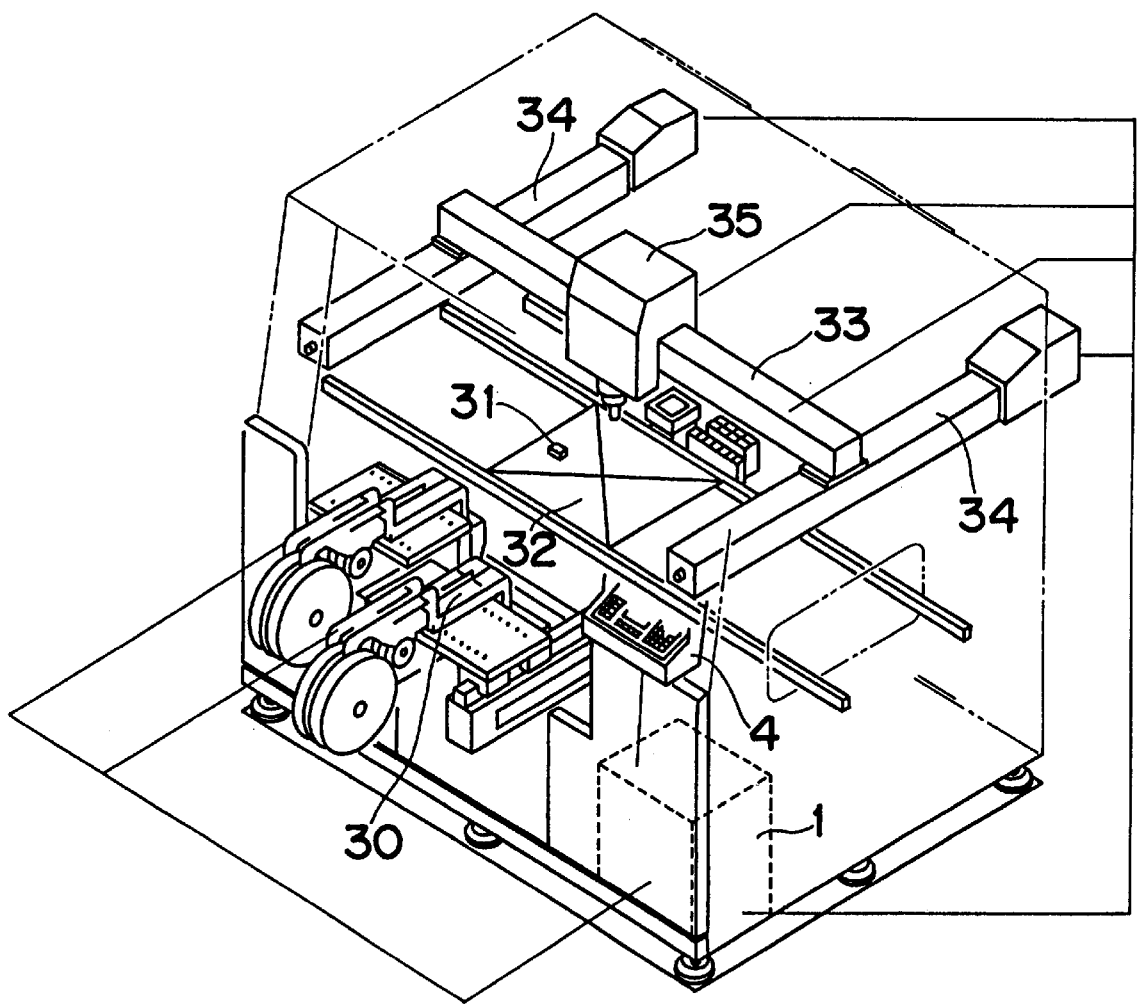
FIG. 1 is a perspective view showing the total schematic constitution of an electronic component mounting apparatus according to one embodiment of the present invention.

Before the description of the present invention proceeds, it is to be noted that like parts are designated by like reference numerals throughout the attached drawings.

An electronic component mounting apparatus according to one embodiment of the present invention will be described with reference to FIGS. 1–11 hereinbelow. In the apparatus according to the embodiment shown in FIG. 1, mechanical specifications of the component feed section 30 for supplying electronic components, X-axis table 33, Y-axis table 34 and head section 35 including the first nozzle 12, second nozzle 13, recognition camera 15 and slide unit 14, etc. apply equally to corresponding parts of the conventional apparatus of FIG. 12, the description of which will therefore be omitted here.

Figure 2:
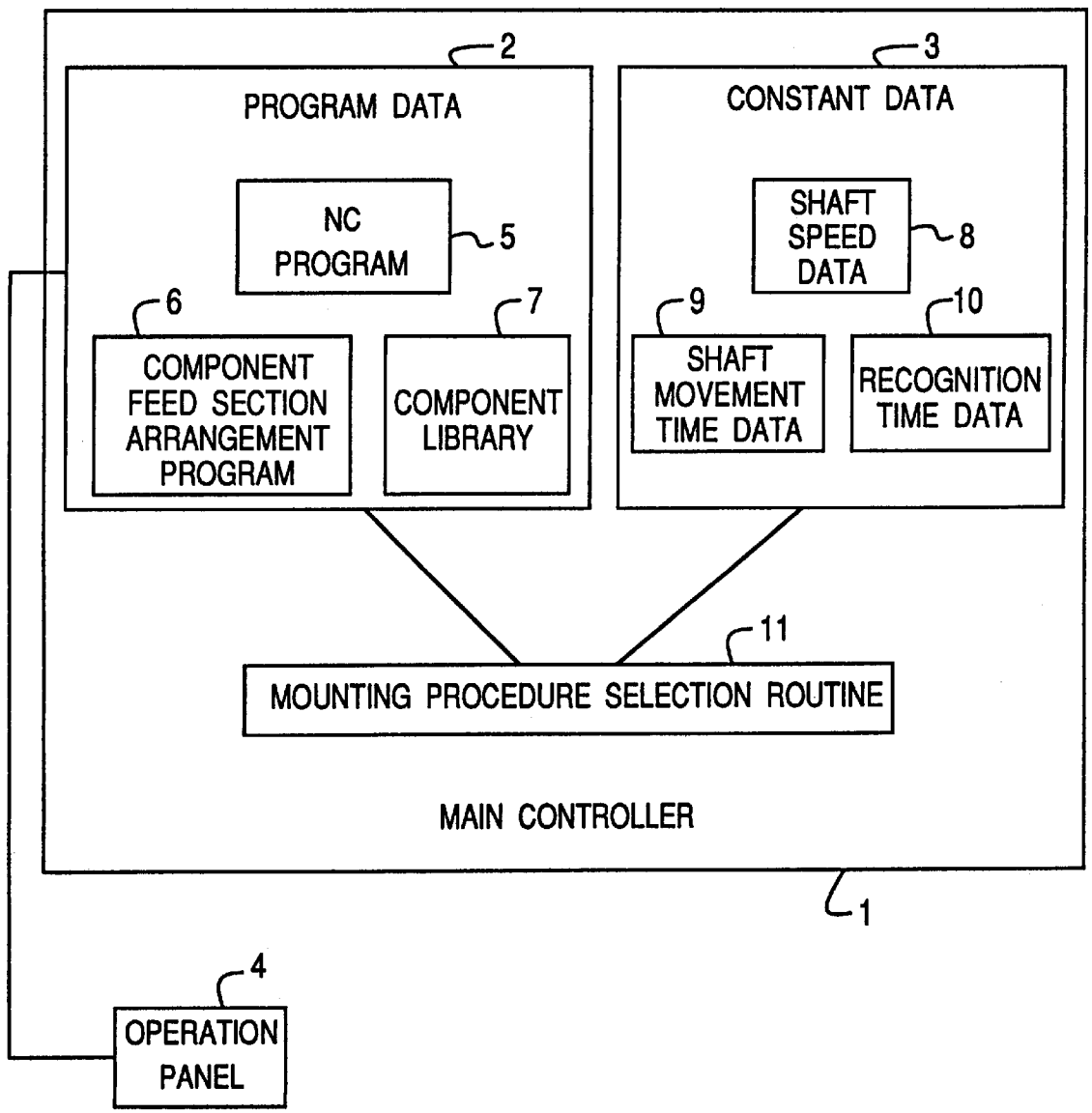
FIG. 2 is a block diagram of a control part in the mounting apparatus of the embodiment.
Figure 3A:
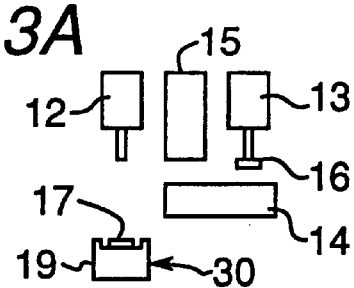
FIGS. 3A, 3B, 3C, 3D, 3E, 3F, 3G, 3H, 3I, and 3J are diagrams respectively diagrammatically explaining processes in a first mounting procedure in the embodiment.
Figure 3F:
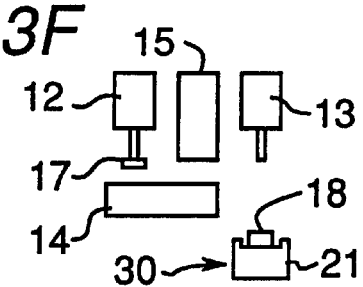
Figure 3B:
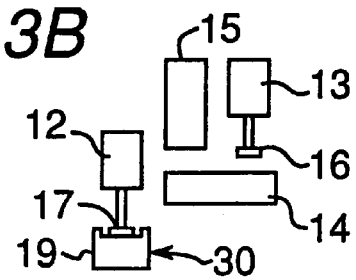
Figure 3G:
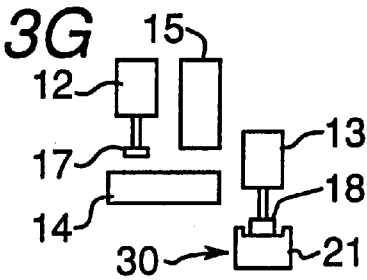
Figure 3C:
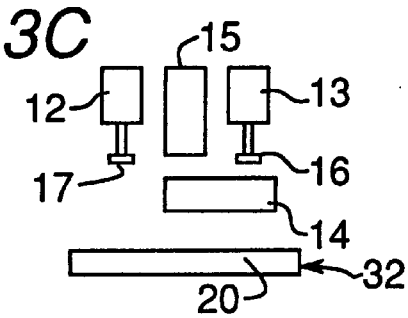
Figure 3H:
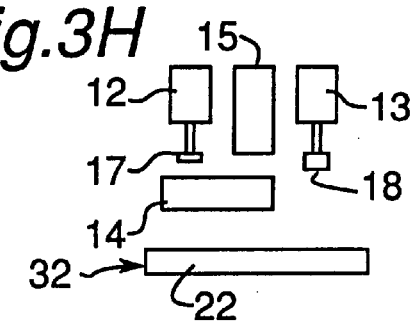
Figure 3D:
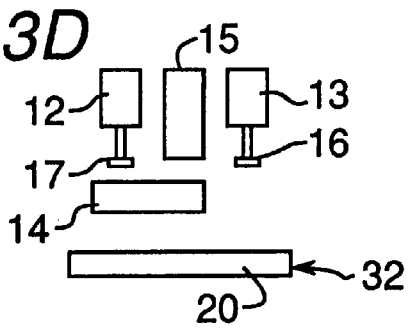
Figure 3I:
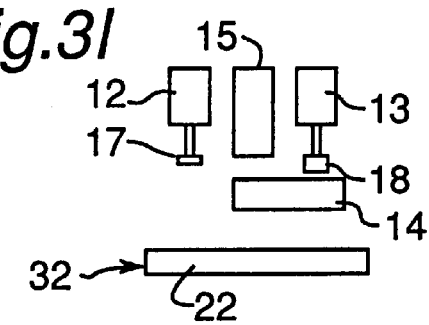
Figure 3E:
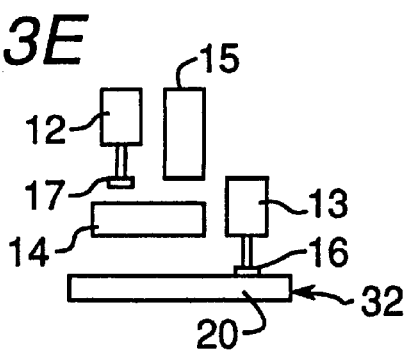
Figure 3J:
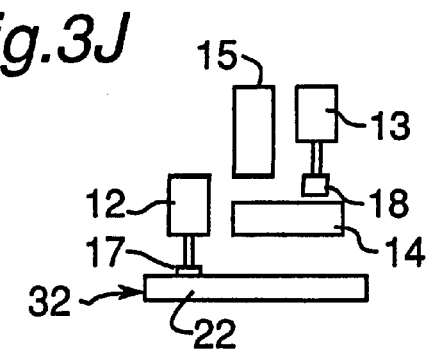

FIG. 2 is a block diagram of a main controller 1 as a control part of the mounting apparatus of the embodiment. In FIG. 2, the main controller 1 is provided with program data 2, constant data 3, and programs for a mounting procedure selection routine 11 to be executed with the utilization of the program data 2 and constant data 3. The main controller 1 controls operations of the electronic component feed section 30, X-axis table 33, Y-axis table 34 and head section 35 having the first nozzle 12, second nozzle 13, recognition camera 15 and slide unit 14, etc.

The program data 2 includes an NC program 5, a component feed section arrangement program 6 and a component library 7. In the NC program 5 are described mounting orders for electronic components, mounting positions for the electronic components on the board 32, layout Nos. of the electronic components sucked by the nozzles 12 and 13 at the component feed section 30, mounting procedures of the using head section 35 and the like data. The arrangement program 6 contains data such as arrangements or layout manners, suction positions for the electronic components, etc. in the component feed section 30. The component library 7 contains data such as dimensions and feeding directions of the components, stages of moving speeds of the X-axis table 33 and Y-axis table 34 during sucking of the electronic components, etc. These programs and data can be edited through an operation panel 4 of the mounting apparatus of the embodiment.

The constant data 3 includes shaft speed data 8, shaft movement time data 9 and recognition time data 10. The shaft speed data 8 includes such data as shaft speeds and accelerations of a screw shaft connected to a rotary shaft of an AC servo motor driving the X-axis table 33, a screw shaft connected to a rotary shaft of an AC servo motor driving the Y-axis table 34, a screw shaft connected to a rotary shaft of a motor moving the slide unit 14, set values of timers for delaying a driving start, and the like. The shaft movement time data 9 includes data, e.g., times required for the first and second nozzles 12, 13 to move up and down, a time required for the slide unit 14 to move, etc. The recognition time data 10 contains data required for recognizing the electronic components and for calculating and correcting postures of the electronic components. The above shaft movement time data 9 and recognition time data 10 will be detailed later with reference to FIG. 10.

In the mounting procedure selection routine 11, before mounting of the electronic components is started, a mounting time of the head section 35 in each procedure is calculated based on the above-described data, so that the procedure of the smallest time is selected. The mounting procedure selection routine 11 will be described later with reference to FIGS. 3A to FIG. 10.

Figure 5:
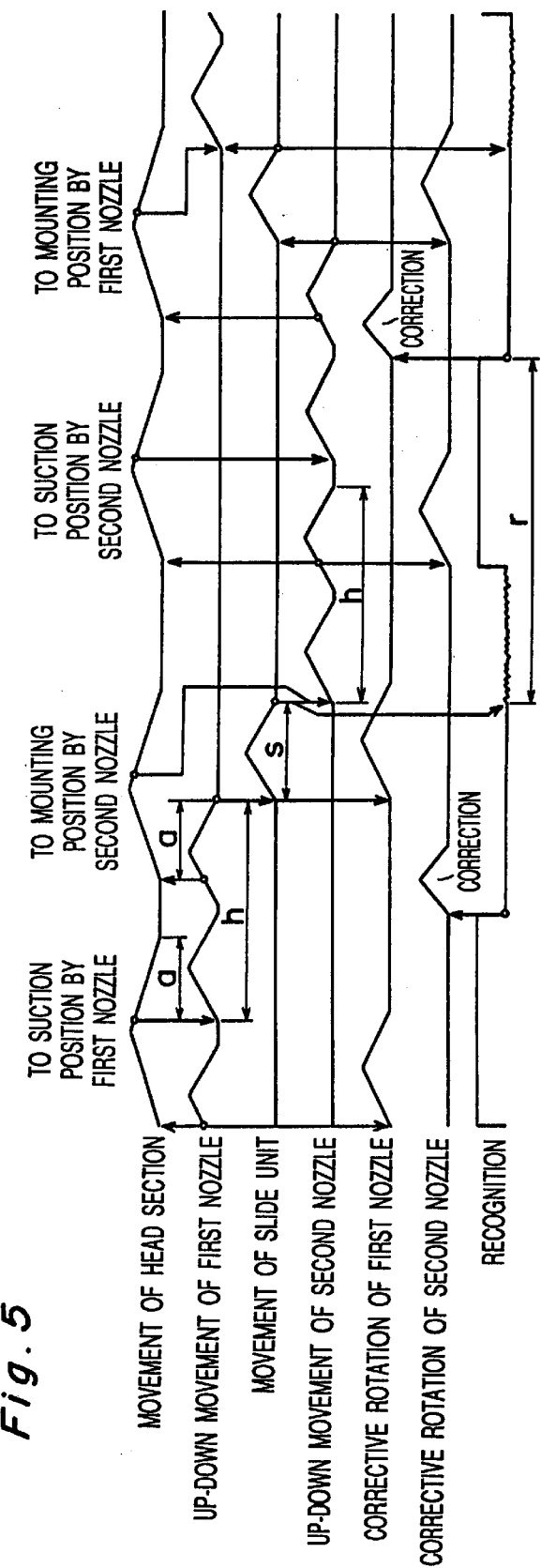
FIG. 5 is a timing chart of the first mounting procedure in the embodiment.

Two mounting procedures in the embodiment will be depicted now. A first mounting procedure is the same as the conventional example described with reference to FIGS. 3A–3J. FIG. 5 is the timing chart of the procedure. Sucking of one component and mounting of another component are alternately repeatedly carried out according to the first procedure.

Figure 6:
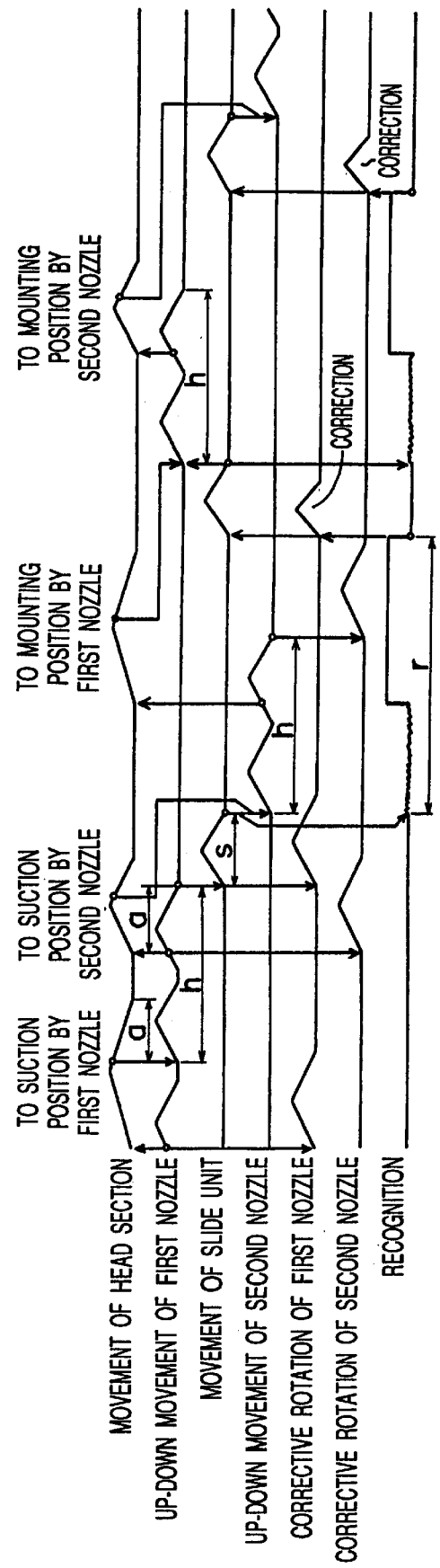
FIG. 6 is a timing chart of the second mounting procedure in the embodiment.

A second mounting procedure is a freshly added procedure for the mounting apparatus, and is diagrammatically shown in FIGS. 4A–4L. FIG. 6 is a timing chart of the second mounting procedure, in which portions shown by inclined lines correspond to a being-driven period (i.e. in which the head section is driven) from the "movement of the head section" to the "corrective rotation of the second nozzle" excluding the "recognition" process, and portions shown by horizontal lines indicate where the apparatus stops operating. Meanwhile, upper straight lines in the recognition process indicate when the recognition process is carried out, and lower straight lines indicate when the recognition process is stopped. Fine sawtoothed portions represent standby times set by the timer. Since the recognition process is conducted after the mirror in the slide unit 14 vibrates and stops its vibration resulting from the movement of the slide unit 14 after receiving a movement completion signal of the slide unit 14, the standby time is provided to wait for the mirror to stop vibrating. According to the second mounting procedure, nozzles 12, 13 sequentially suck electronic components and then sequentially mount the components. This second mounting procedure will be described with reference to FIGS. 4A–4L and 6.

Figure 4A:
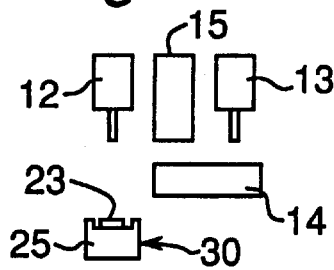
FIGS. 4A, 4B, 4C, 4D, 4E, 4F, 4G, 4H, 4I, 4J, 4K, and 4L are diagrams respectively diagrammatically explaining processes in a second mounting procedure in the embodiment.
Figure 4E:
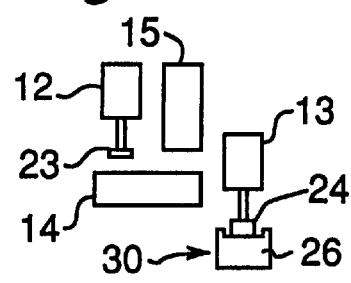
Figure 4I:
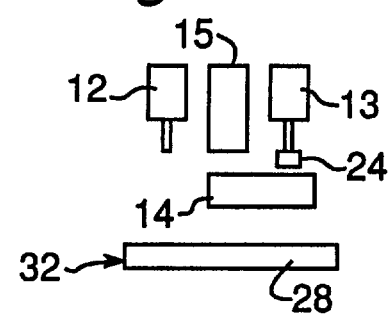
Figure 4B:
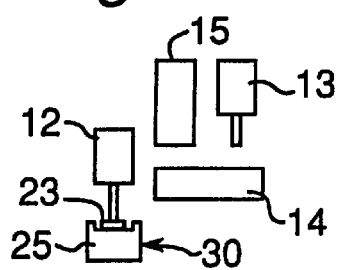

The head section 35 is moved by the X-axis and Y-axis tables 33 and 34 to a suction position 25 of the feed section 30 for suction of an electronic component 23 by the first nozzle 12 (FIG. 4A). When the head section is perfectly moved to the suction position 25 by the first nozzle 12, the first nozzle 12 comes down to suck the electronic component 23 at the suction position 25 (FIG. 4B). When the electronic component 23 is completely sucked by the first nozzle 12, the first nozzle 12 moves up and the head section 35 starts to move to a suction position 26 of the feed section 30 for suction of an electronic component 24 by the second nozzle 13 (FIG. 4C). Upon completion of the rise of the first nozzle 12, the slide unit 14 moves to the side of the first nozzle 12 (FIG. 4D). When the slide unit 14 finishes the movement and the head section 35 finally reaches the suction position 26 of the second nozzle 13 for suction of the electronic component 24, the second nozzle 13 descends to suck the electronic component 24 at the suction position 26 (FIG. 4E).

Figure 4F:
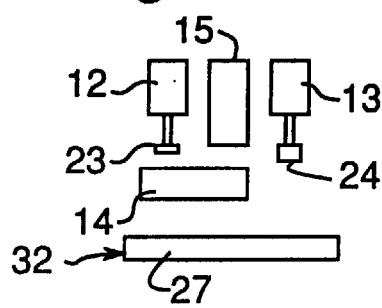
Figure 4J:
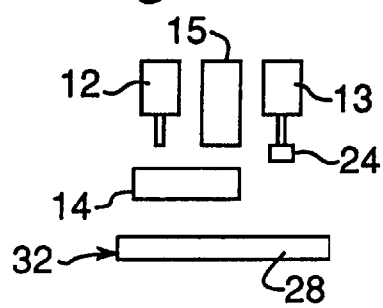
Figure 4C:
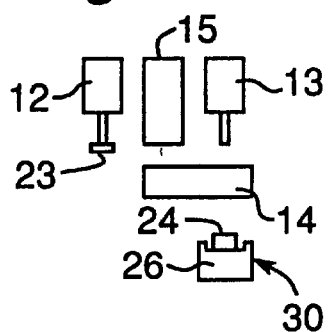
Figure 4G:
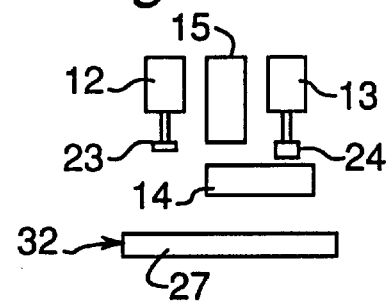
Figure 4K:
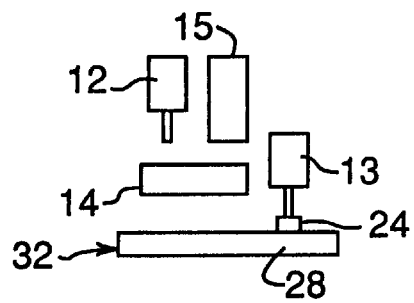
Figure 4D:
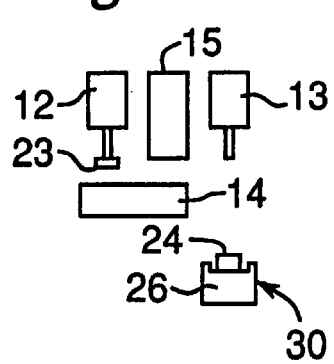
Figure 4H:
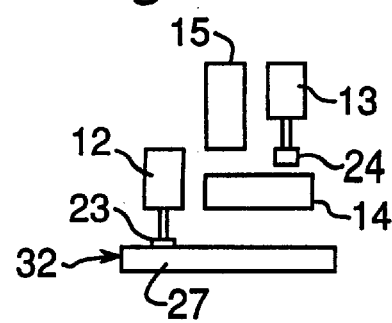

When the second nozzle 13 finishes sucking of the electronic component 24, the second nozzle 13 moves upward and the head section 35 starts to move to a mounting position 27 of the board 30 for mounting for the electronic component 23 sucked by the first nozzle 12 (FIG. 4F). While the second nozzle 13 sucks the electronic component 24 and the head section 35 moves to the mounting position 27, a posture of the electronic component 23 sucked by the first nozzle 12 is recognized by the recognition camera 15, and a correction calculation is started to correct the sucked posture. After the correction calculation is completed through the recognition, the slide unit 14 moves to the side of the second nozzle 13 (FIG. 4G). At the same time, a suction posture of the first nozzle 12 relative to the head section 35 is corrected on the basis of the correction calculation. After the slide unit 14 completes moving and the head section 35 completely moves to the mounting position 27 for mounting of the electronic component 23 sucked by the first nozzle 12, the first nozzle 12 moves down to thereby mount the electronic component 23 to the mounting position 27 of the board 30 (FIG. 4H).

When the first nozzle 12 has complete mounting of the electronic component 23 to the board 30, the first nozzle 12 then moves up and the head section 35 moves to a mounting position 28 of the board 30 for mounting of the electronic component 24 sucked by the second nozzle 13 (FIG. 4I).

While the first nozzle 12 mounts the electronic component 23 to the board 30 and the head section 35 moves to the mounting position 28, the recognition camera 15 recognizes a suction posture of the electronic component 24 sucked by the second nozzle 13, and a correction calculation is started to correct the posture. After completion of the correction calculation based on the recognition, the slide unit 14 moves to the side of the first nozzle 12 (FIG. 4J) and moreover, a sucking posture of the second nozzle 13 relative to the head section 35 is corrected on the basis of the result of the correction calculation. After the movement of the slide unit 14 and also the movement of the head section 35 to the mounting position 28 on the board 30 for mounting for the electronic component 24 sucked by the second nozzle 13 are completed, the second nozzle 13 descends, thereby mounting the sucked electronic component 24 to the mounting position 28 of the board 30 (FIG. 4K).

Figure 4L:
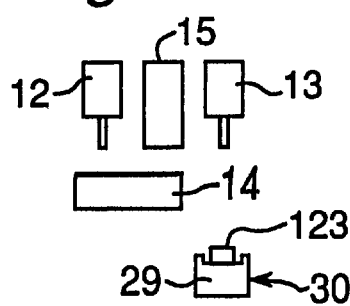

After the mounting by the second nozzle 13 is finished, the second nozzle 13 moves up and the head section 35 starts to move to a suction position 29 of the feed section 30 for suction of an electronic component 123 to be sucked next by the second nozzle 13 (FIG. 4L). Subsequently, the mounting procedure is carried out with the first nozzle 12 and second nozzle 13 reversed in order. Electronic components are mounted by repeating a sequence of the above-described operations.

According to the mounting apparatus of the embodiment, a mounting procedure selection column in the NC program 5 is edited with the use of the operation panel 4, and therefore one of the two mounting procedures can be optionally selected and set.

The mounting procedure selection routine 11 will be described with reference to FIGS. 3A–10.

Figure 7:
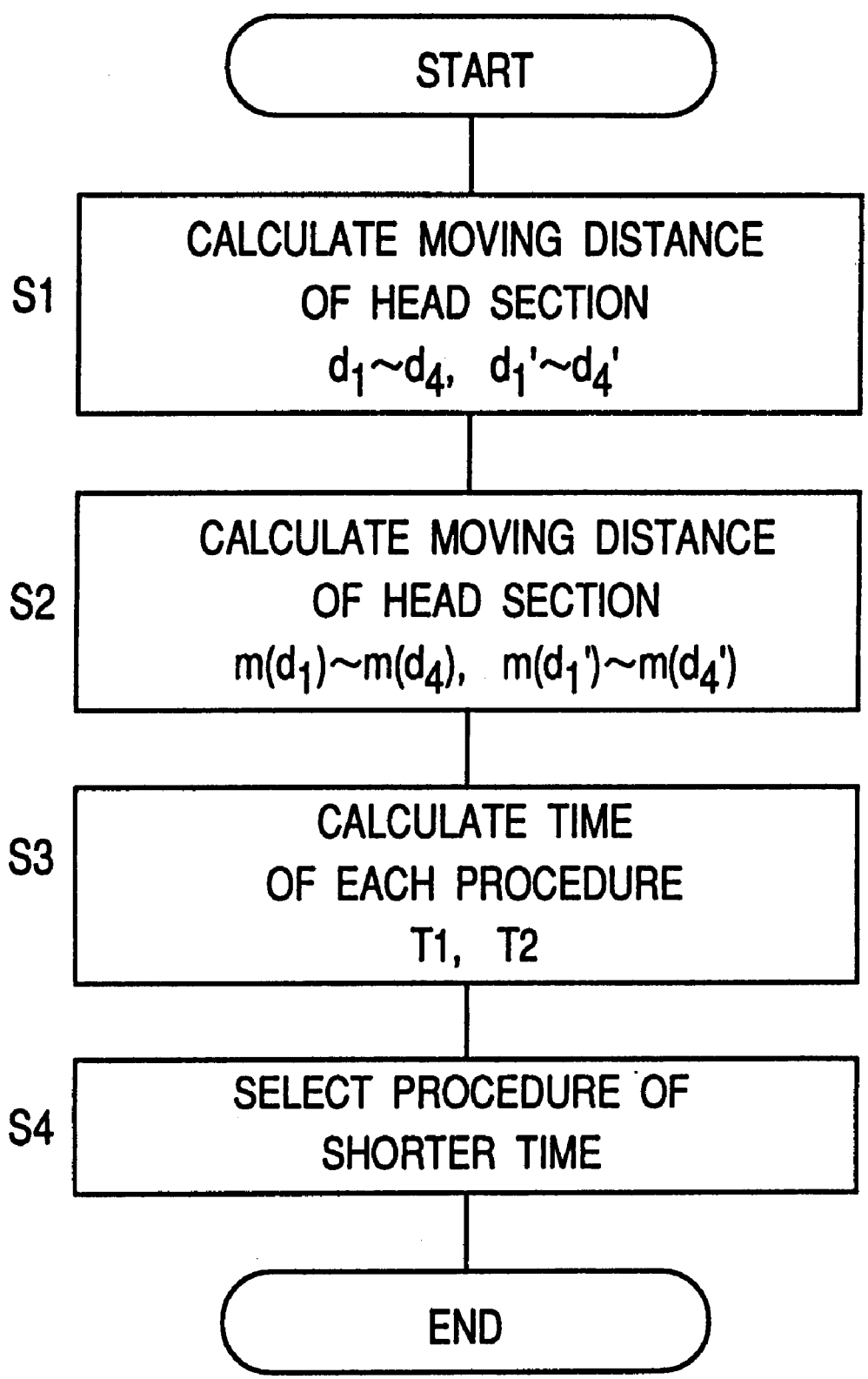
FIG. 7 is a flow chart of a routine for calculating a mounting time of each procedure in the embodiment.

FIG. 7 is a flow chart of the mounting procedure selection routine 11. According to the routine 11, in the first place, moving distances $d_1$–$d_4$ and $d_1'$–$d_4'$ of the head section 35 are calculated (step S1). Moving times $m(d_1)$–$m(d_4)$ and $m(d_1')$–$m(d_4')$ of the head section 35 are then calculated (step S2). Times T1, T2 in respective procedures are calculated (step S3). A faster one of the procedures is selected (step S4). The mounting procedure selection routine 11 is started when n>2 and n is an odd number when an (n)th electronic component is to be sucked by the first, second nozzle 12, 13.

Figure 8A:
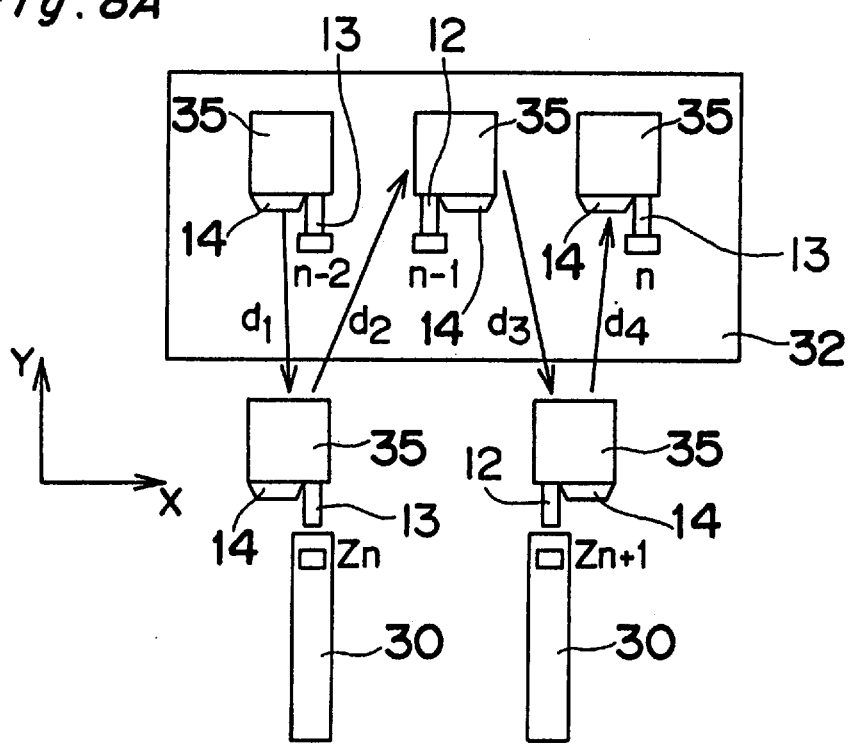
FIGS. 8A and 8B are explanatory diagrams of the first and second mounting procedures schematically showing a state where a head section is moved in the embodiment.
Figure 8B:
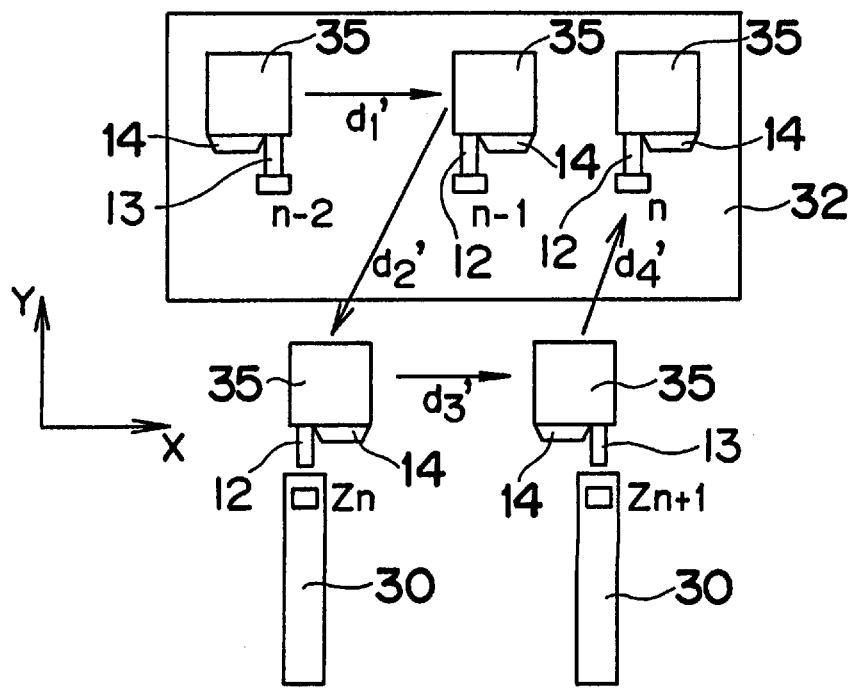

FIGS. 8A and 8B are diagrams of the movement of the head section 35; specifically, FIG. 8A shows the movement in the first mounting procedure and FIG. 8B corresponds to the second mounting procedure. Either of the mounting procedures requiring a larger moving distance of the X-axis and Y-axis tables 33, 34 is detected in the routine 11. Concretely, moving distances $d_1$–$d_4$ in FIG. 8A and moving distances $d_1'$–$d_4'$ in FIG. 8B are obtained according to the NC program 5 and arrangement program 6. Calculation formulae are as follows.

$$d_1 = \max(|x_{n-2} - x_{zn}|, |y_{n-2} - y_{zn}|)$$

$$d_2 = \max(|x_{n-1} - x_{zn} + b|, |y_{n-1} - y_{zn}|)$$

$$d_3 = \max(|x_{n-1} - x_{zn+1}|, |y_{n-1} - y_{zn+1}|)$$

$$d_4 = \max(|x_n - x_{zn+1} - b|, |y_n - y_{zn+1}|)$$

$$d_1' = (|x_{n-1} - x_{zn-2}|)$$

$$d_2' = \max(|x_{n-1} - x_{zn}|, |y_{n-1} - y_{zn}|)$$

$$d_3' = |x_{zn+1} - x_{zn} - b|$$

$$d_4' = \max(|x_n - x_{zn+1} + b|, |y_n - y_{zn+1}|)$$

"$X_n$" is an x coordinate of the mounting position of the (n)th electronic component to the board 30 and, "$y_n$" is a y coordinate of the mounting position of the same electronic component. "$z_n$" is an (n)th layout No. at the feed section 30. "$x_{zn}$" is accordingly an x coordinate of the suction position of the electronic component at the layout No. $_{zn}$. "$y_{zn}$" is a y coordinate of the suction position of the electronic component at the layout No. $_{zn}$. "max(i,j)" is a function to obtain a larger one of i and j, and "b" is a distance between the two nozzles 12 and 13.

In the selection routine 11, then, times required for the X-axis table 33 or Y-axis table 34 to move the distances $d_1$–$d_4$ or $d_1'$–$d_4'$ are calculated, which will be discussed in detail with reference to FIGS. 9A and 9B.

FIGS. 9A and 9B are diagrams of the movement of the Y-axis and Y-axis tables 33 and 34. Calculations in the selection routine 11 are based on the condition that the tables move at an equal acceleration. In FIGS. 9A and 9B, "$V_{max}$" is a maximum velocity (unit: pulse/s) determined for each speed stage and "$V'_{max}$" is an achieved maximum velocity (unit: pulse/s), holding a relation of $V'_{max} < V_{max}$. "α" is an acceleration (unit: pulse/s$^2$) of each screw shaft of the X-axis and Y-axis tables 33 and 34, "d" is a moving distance (unit: mm) of each screw shaft and, "m(d)" is a time (unit: s) required for moving the distance d. The "pulse" in the unit of the above velocity and acceleration indicates a driving pulse of the AC servo motor of the X-axis table 33, Y-axis table 34. FIG. 9A is the diagram when the tables move at an equal velocity after achieving the determined maximum velocity. On the other hand, FIG. 9B shows the case when they do not reach the determined maximum velocity.

Since 500 pulses of the encoder built in the AC servo motor corresponds to 1 mm, the function m(d) of the required moving time of the X-axis table 33 or Y-axis table 34 for the moving distance d is detected based on FIGS. 9A and 9B as follows.

When $\sqrt{500\,\alpha d} \geq V_{max}$, $m(d) = V_{max}/\alpha + 500\,d/V_{max}$ When $\sqrt{500\,\alpha d} < V_{max}$, $m(d) = 2\sqrt{500\,\alpha d}$ In the above expressions, "sqrt" is a function for obtaining a square. Values of Vmax and α can be obtained from the shaft speed data 8 on the basis of the speed stage of the head section 35 in the component library 7.

The time required for the X-axis table 33 or Y-axis table 34 to move the distances $d_1$–$d_4$ and $d_1'$–$d_4'$ is calculated with the use of the function m(d) in the selection routine 11.

Thereafter, the mounting time in each mounting procedure is calculated based on the timing charts of FIGS. 5 and 6 by the selection routine 11. FIG. 10 indicates parameters used in calculating the mounting times in the selection routine 11, which are included in the shaft movement time data 9 and recognition time data 10. Symbols h, a, s and r in FIG. 10 correspond to those in FIGS. 5 and 6.

Each parameter in FIG. 10 will be described below. A sucking/mounting time h (unit: s) is a time interval after the first and second nozzles 12, 13 start to descend, through the suction of the components, until the first and second nozzles 12, 13 finish moving up. Values of the sucking/mounting time h of the first and second nozzles 12, 13 in every speed stage are described in the shaft movement time data 9. An arch motion time a (unit: s) is a time while both the movement of the X-axis table 33 or Y-axis table 34 and the up-down movement of the first and second nozzles 12, 13 are conducted at the same time, with a front end of each nozzle moving in a locus of an arch. Values of the arch motion time a of the head section 35 and the first and second nozzles 12, 13 for every speed stage are described in the shaft movement time data 9. A moving time s (unit: s) of the slide unit 14 is a time required for the slide unit 14 to move from one nozzle towards the other nozzle. Values of the moving time s of the slide unit 14 for every speed stage are described in the shaft movement time data 9. A sucking posture recognition time r (unit: s) is a time after the timer is started to secure a vibration counteractive time (standby time before the vibration of the mirror incorporated in the slide unit 14 which is caused due to the movement of the slide unit 14 is stopped) after the completion of the movement of the slide unit 14 before an image of the sucked electronic component is taken in and the amount for correcting the sucked posture is finished being calculated. The sucked posture recognition time r required for every electronic component is described in the recognition time data 10.

The mounting time of each procedure is calculated by the selection routine 11 with the use of the following expressions from times $m(d_1)$–$m(d_4)$, $m(d_1')$–$m(d_4')$ required by the X-axis table 33 or Y-axis table 34 to move the distances $d_1$–$d_4$ and $d_1'$–$d_4'$, shaft movement time data 9 and recognition time data 10.

A mounting time T1 (unit: s) of the first mounting procedure is calculated according to expressions below.

(1) When $m(d_2)<2a+s$ and $m(d_4)<2a+s$, $T1=(m(d_1)+m(d_3)+4h-4a+2s)/2$ (2) When $m(d_2)>2a+s$ and $m(d_4)<2a+s$, $T1=(m(d_1)+m(d_2)+m(d_3)+4h-6a+s)/2$ (3) When $m(d_2)<2a+s$ and $m(d_4)>2a+s$, $T1=(m(d_1)+m(d_3)+m(d_4)+4h-6a+s)/2$ (4) When $m(d_2)\geq 2a+s$ and $m(d_4)>2a+s$, $T1=(m(d_1)+m(d_2)+m(d_3)+m(d_4)+4h-8a)/2$ A mounting time T2 (unit: s) of the second mounting procedure is calculated according to expressions below.

(1) When $m(d_1')<r-h+2a+s$, $m(d_3')<2a+s$, and $m(d_4')<r-h+2a+a$, $T2=(m(d_2')+2h-2a+3s+2r)/2$ (2) When $m(d_1')\geq r-h+2a+s$, $m(d_3')<2a+s$, and $m(d_4')<r-h+2a+a$, $T2=(m(d_1')+m(d_2')+3h-4a+2s+r)/2$ (3) When $m(d_1')<r-h+2a+s$, $m(d_3')\geq 2a+s$, and $m(d_4')<r-h+2a+a$, $T2=(m(d_2')+m(d_3')+2h-4a+2s+2r)/2$ (4) When $m(d_1')\geq r-h+2a+s$, $m(d_3')\geq 2a+s$, and $m(d_4')<r-h+2a+a$, $T2=(m(d_1')+m(d_2')+m(d_3')+3h-6a+s+r)/2$ (5) When $m(d_1')<r-h+2a+s$, $m(d_3')<2a+s$, and $m(d_4')\geq r-h+2a+a$, $T2=(m(d_2')+m(d_4')+3h-4a+2s+r)/2$ (6) When $m(d_1')\geq r-h+2a+s$, $m(d_3')<2a+s$, and $m(d_4')\geq 2r-h+2a+a$, $T2=(m(d_1')+m(d_2')+m(d_4')+4h-6a+s)/2$ (7) When $m(d_1')<r-h+2a+s$, $m(d_3')\geq 2a+s$, and $m(d_4')\geq r-h+2a+a$, $T2=(m(d_2')+m(d_3')+m(d_4')+3h-6a+s)/2$ (8) When $m(d_1')\geq r-h+2a+s$, $m(d_3')\geq 2a+s$, and $m(d_4')\geq r-h+2a+a$, $T2=(m(d_1')+m(d_2')+m(d_3')+m(d_4')+4h-8a)/2$ The mounting procedure selection routine 11 selects a faster procedure based on the calculated mounting times T1 and T2.

Figure 11:
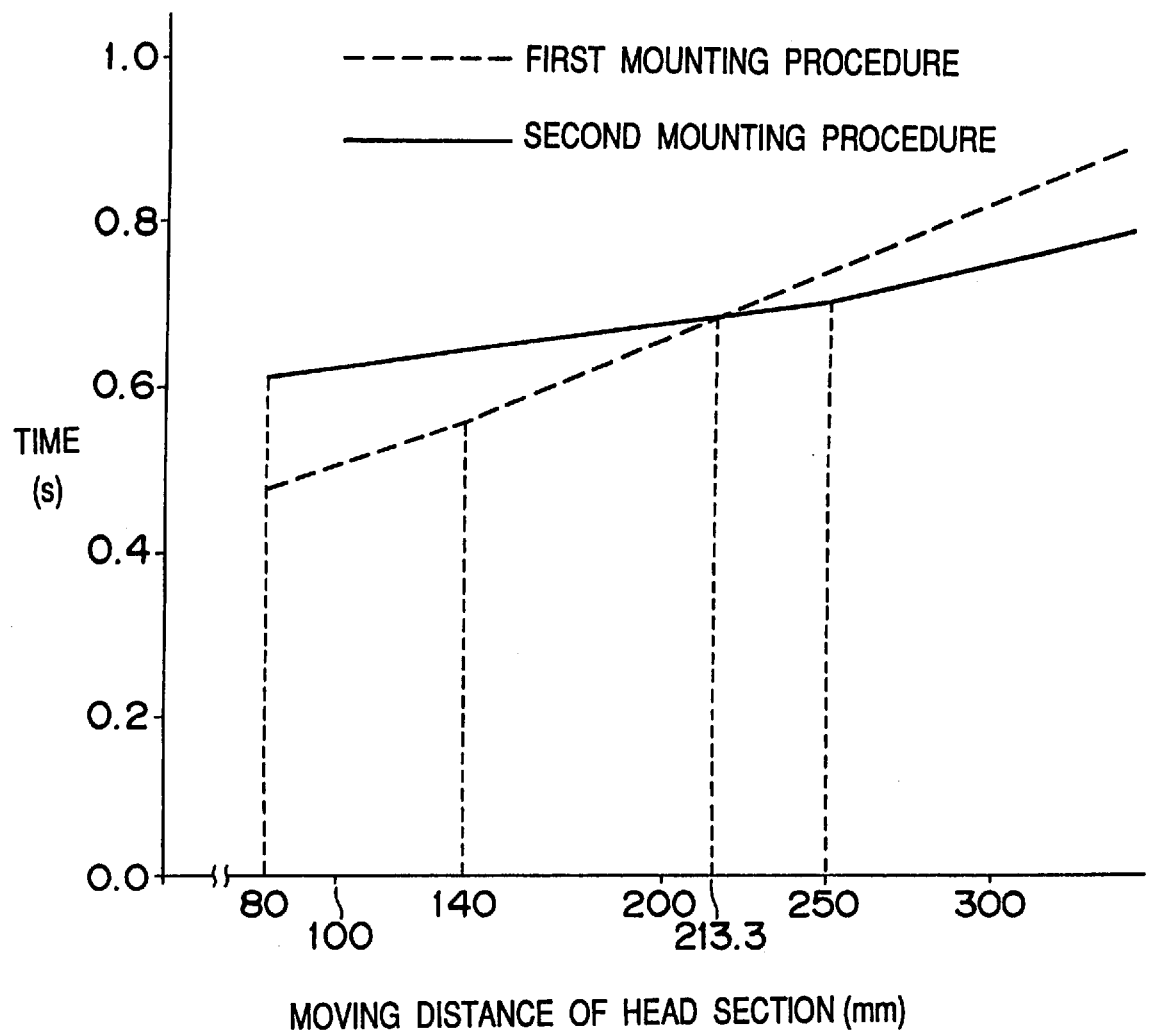
FIG. 11 is a comparative diagram of mounting times in the two mounting procedures in the embodiment.
Figure 12:
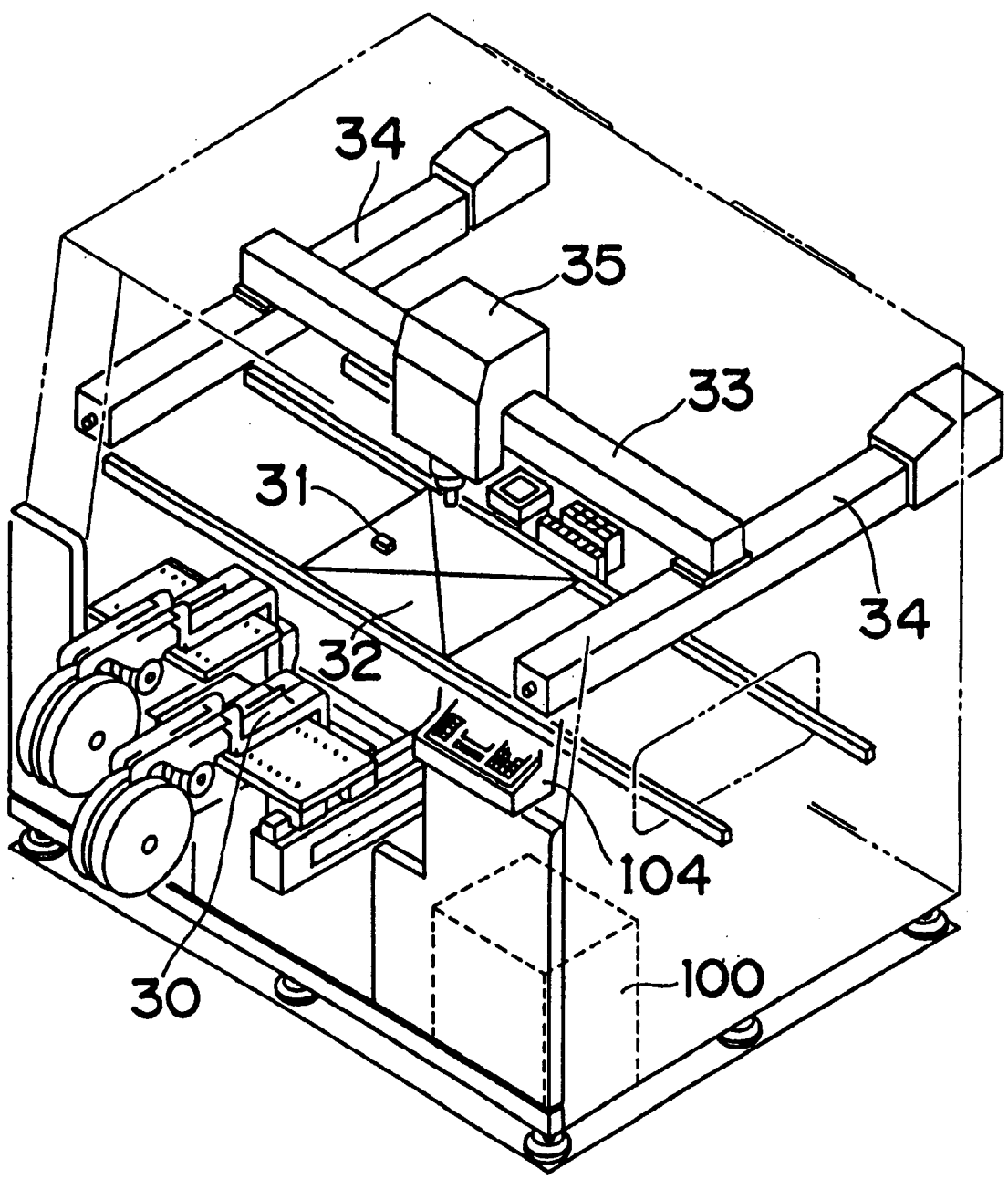
FIG. 12 is a perspective view of the total schematic constitution of a conventional electronic component mounting apparatus.

FIG. 11 is a diagram of a relation of the moving distance of the head section 35, namely, a larger moving distance of the X-axis table 33 and Y-axis table 34 and the mounting time in two mounting procedures, which can be compared in FIG. 11.

The above calculations are on the assumption that $m(d_1)=m(d_2)=m(d_3)=m(d_4)=m(d_2')=m(d_4')$ $m(d_1')<r-h+2a+s$ $m(d_3')<2a+s$ $h=0.190, a=0.070, s=0.080, r=0.300$ It is clear from FIG. 11 that the second mounting procedure is faster than the first mounting procedure when the moving distance of the head section 35, i.e., larger one of the moving distances of the X-axis table 33, Y-axis table 34 exceeds 213.3 (mm).

According to the present embodiment as described hereinabove, the head section 35 can be driven according to the first procedure and according to the second procedure. The mounting time of each procedure is calculated in the mounting procedure selection routine 11 based on the program data 2 and the constant data 3 in the main controller 1, and the faster procedure is selected. Therefore, a loss in mounting time generated if the mounting procedure is a single procedure can be reduced and the mounting time per board can be shortened. The operating procedure can be set optionally through the operation panel 4.

According to the mounting method and apparatus of the embodiment, as is made clear from the foregoing description, the head section 35 can be selectively driven while one board is treated for mounting, according to the first mounting procedure whereby one electronic component is sucked and completely mounted and then the other electronic component is sucked and mounted and according to the second mounting procedure whereby two electronic components are sucked and then mounted. Through the suitable selection of the mounting procedure, the loss in mounting time caused if the mounting procedure is one single procedure can be decreased, so that the mounting time per board can be reduced.

Since the required mounting time in each procedure is calculated before the mounting is started and the procedure of a shorter required time is automatically selected, the mounting time for every board can be automatically shortened.

Further, the operation panel 4 installed as one means for the operator to select among the two mounting procedures enables optional selection of the mounting procedures.

Although the mounting time required in each procedure is calculated before the mounting in the above-described embodiment, if necessary, the mounting time may be calculated even during mounting to thereby suitably change the mounting procedure. For instance, although the mounting is started in accordance with the mounting procedure selected before the mounting in the above embodiment, in the case where the electronic components become short at the feed section in the middle of mounting, and consequently the suction position should be changed from the original one, the mounting time may be calculated again and an optimum mounting procedure may be re-selected. Data of the other suction positions at which the electronic components of the same kind are arranged are recorded in the component feed section arrangement program 6, and therefore, where to suck the electronic components of the same kind can be detected by reading the data in the event that the supply of the electronic components is interrupted.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for mounting electronic components at an electronic component feed section onto a board with use of a head section having a plurality of nozzles for sucking the electronic components and a recognition camera for recognizing a posture of the electronic component sucked by each of the nozzles through its image, which comprises: sucking the electronic components at the feed section with use of the nozzles; image-recognizing the sucked posture of the electronic components by the recognition camera; correcting the sucked posture of the electronic components; calculating to determine which period of time is shorter between a period of time required for mounting according to a first mounting procedure in which components are alternatingly sucked and mounted by the nozzles onto the board, and a period of time required for mounting according to a second mounting procedure in which sucking of electronic components by the plurality of nozzles is consecutively carried out and then mounting by the plurality of nozzles is conducted consecutively; selecting the one of the first and second mounting procedures requiring the shorter period of time; and driving the head section to cause mounting of the electronic components on the board according to the selected one of the first and second mounting procedures.

2. A mounting method according to claim 1, wherein said calculating to determine which period of time is shorter comprises calculating a period of time required for mounting the electronic components according to each of the first and second mounting procedures before the mounting.

3. A mounting method according to claim 2, wherein a required period of time for mounting the components according to each of the first and second mounting procedures is calculated again if a supply of electronic components to be sucked by the nozzles becomes short and a replacement electronic component is to be sucked at a suction position different from that of the original electronic component, so that the mounting procedure is re-selected.

4. A mounting method according to claim 2, wherein the period of time required for mounting the components according to each of the first and second mounting procedures is calculated based on a period of time required for the head section to move to a mounting position for each of the electronic components, a period of time required for the head section to move to the suction position for each of the electronic components and a period of time required for recognizing and correcting the sucked posture of each of the electronic components.

5. A mounting method according to claim 1, wherein the first and second mounting procedures to be selected can be optionally set by an operator.

6. An apparatus for mounting electronic components at an electronic component feed section onto a board, which comprises: a head section having a plurality of nozzles for sucking the electronic components and a recognition camera for recognizing a posture of the electronic component sucked by each of the nozzles through images; and a control part which controls the head section so that, after the electronic components at the feed section are sucked by the nozzles, the sucked postures of the electronic components are image-recognized by the recognition camera and the sucked postures relative to the head section are corrected, the components are mounted on the boards wherein the control part is provided with calculation means for calculating to determine which period of time is shorter between a period of time required for mounting according to a first mounting procedure whereby components are alternatingly sucked and mounted by the nozzles onto the board, and a period of time required for mounting according to a second mounting procedure whereby sucking of electronic components by the plurality of nozzles is consecutively carried out and then mounting by the plurality of nozzles is conducted consecutively, selection means for selecting the one of the first and second mounting procedures requiring the shorter period of time and means for driving the head section to cause mounting of the electronic components onto the board according to the selected one of the first and second mounting procedures.

7. A mounting apparatus according to claim 6, wherein said calculation means is operable for calculating a period of time required for mounting of the electronic components according to each of the first and second mounting procedures, in order to determine which period of time is shorter.

8. A mounting apparatus according to claim 7, wherein the calculation means is constituted to calculate the period of time required for mounting the components according to each of the first and second mounting procedures based on a period of time required for the head section to move to a mounting position on the board for each of the electronic components, a period of time required for the head section to move to the suction position at the feed section for each of the electronic components and a period of time required for recognizing and correcting the sucked posture of each of the electronic components.

9. A mounting method according to claim 6, wherein a means is provided allowing an operator to optionally set the mounting procedure to be selected by the selection means.

10. A mounting method according to claim 3, wherein the period of time required for mounting the components according to each of the first and second mounting procedures is calculated based on a period of time required for the head section to move to a mounting position for each of the electronic components, a period of time required for the head section to move to the suction position for each of the electronic components and a period of time required for recognizing and correcting the sucked posture of each of the electronic components.

11. A mounting method according to claim 2, wherein the first and second mounting procedures to be selected can be optionally set by an operator.

12. A mounting method according to claim 3, wherein the first and second mounting procedures to be selected can be optionally set by an operator.

13. A mounting method according to claim 4, wherein the first and second mounting procedures to be selected can be optionally set by an operator.

14. A mounting apparatus according to claim 7, wherein a means is provided allowing an operator to optionally set the mounting procedure to be selected by the selection means.

15. A mounting apparatus according to claim 8, wherein a means is provided allowing an operator to optionally set the mounting procedure to be selected by the selection means.

16. A method for mounting electronic components at an electronic component feed section onto a board with use of a head section having a plurality of pick-up parts for picking up the electronic components and a recognition camera for recognizing a posture of the electronic component picked up by each of the nozzles through its image, which comprises:

picking up the electronic components at the feed section with use of the pick-up parts; image-recognizing the picked-up posture of the electronic components by the recognition camera; correcting the picked-up posture of the electronic components; calculating to determine which period of time is shorter between a period of time required for mounting according to a first mounting procedure in which components are alternatingly picked-up and mounted by the nozzles on the board, and a period of time required for mounting according to a second mounting procedure in which picking up of electronic components by the plurality of pick-up parts is consecutively carried out and then mounting by the plurality of pick-up parts is conducted consecutively; selecting the one of the first and second mounting procedures requiring the shorter period of time; and driving the head section to cause mounting of the electronic components on the board according to the selected one of the first and second mounting procedures.

17. A mounting method according to claim 16, wherein said calculating to determine which period of time is shorter comprises calculating a period of time required for mounting the electronic components according to each of the first and second mounting procedures.

18. A mounting method according to claim 17, wherein a required period of time for mounting the components according to each of the first and second mounting procedures is calculated again if a supply of electronic components to be picked-up by the pick-up parts becomes short and a replacement electronic component is to be picked up at a pick-up position different from that of the original electronic component, so that the mounting procedure is re-selected.

19. A mounting method according to claim 18, wherein the period of time required for mounting the components according to each of the first and second mounting procedures is calculated based on a period of time required for the head section to move to a mounting position for each of the electronic components, a period of time required for the head section to move to the pick-up position for each of the electronic components and a period of time required for recognizing and correcting the picked-up posture of each of the electronic components.

20. A mounting method according to claim 17, wherein the period of time required for mounting the components according to each of the first and second mounting procedures is calculated based on a period of time required for the head section to move to a mounting position for each of the electronic components, a period of time required for the head section to move to the pick-up position for each of the electronic components and a period of time required for recognizing and correcting the picked-up posture of each of the electronic components.

21. A mounting method according to claim 20, wherein the first and second mounting procedures to be selected can be optionally set by an operator.

22. A mounting method according to claim 18, wherein the first and second mounting procedures to be selected can be optionally set by an operator.

23. A mounting method according to claim 17, wherein the first and second mounting procedures to be selected can be optionally set by an operator.

24. A mounting method according to claim 16, wherein the first and second mounting procedures to be selected can be optionally set by an operator.

25. An apparatus for mounting electronic components at an electronic component feed section onto a board, which comprises: a head section having a plurality of pick-up parts for picking up the electronic components and a recognition camera for recognizing a posture of the electronic component picked up by each of the pick-up parts through images; and a control part which controls the head section so that, after the electronic components at the feed section are picked up by the pick-up parts, the picked-up postures of the electronic components are image-recognized by the recognition camera and the picked-up postures relative to the head section are corrected, the components are mounted to the board, wherein the control part is provided with calculation means for calculating to determine which period of time is shorter between a period of time required for mounting according to a first mounting procedure whereby components are alternatingly picked-up and mounted by the pick-up parts onto the board, and a period of time required for mounting according to a second mounting procedure whereby picking up of electronic components by the plurality of pick-up parts is consecutively carried out and then mounting by the plurality of pick-up parts is conducted consecutively, selection means for selecting the one of the first and second mounting procedures requiring the shorter period of time and means for driving the head section to cause mounting of the electronic components onto the board according to the selected one of the first and second mounting procedures.

26. A mounting apparatus according to claim 25, wherein said calculation means is operable for calculating a period of time required for mounting of the electronic components according to each of the first and second mounting procedures, in order to determine which period of time is shorter.

27. A mounting apparatus according to claim 26, wherein the calculation means is constituted to calculate the period of time required for mounting the components according to each of the first and second mounting procedures based on a period of time required for the head section to move to a mounting position on the board for each of the electronic components, a period of time required for the head section to move to the pick-up position at the feed section for each of the electronic components and a period of time required for recognizing and correcting the picked-up posture of each of the electronic components.

28. A mounting apparatus according to claim 27, wherein a means is provided allowing an operator to optionally set the mounting procedure to be selected by the selection means.

29. A mounting apparatus according to claim 26, wherein a means is provided allowing an operator to optionally set the mounting procedure to be selected by the selection means.

30. A mounting apparatus according to claim 25, wherein a means is provided allowing an operator to optionally set the mounting procedure to be selected by the selection means.

* * * * *